(12) United States Patent
Komurasaki et al.

(10) Patent No.: US 6,798,678 B2
(45) Date of Patent: Sep. 28, 2004

(54) FREQUENCY VOLTAGE CONVERTER

(75) Inventors: Hiroshi Komurasaki, Tokyo (JP); Hisayasu Sato, Tokyo (JP); Takahiro Miki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 696 days.

(21) Appl. No.: 09/900,017

(22) Filed: Jul. 9, 2001

(65) Prior Publication Data
US 2002/0097592 A1 Jul. 25, 2002

(30) Foreign Application Priority Data
Jan. 24, 2001 (JP) ........................................ 2001-016268

(51) Int. Cl.[7] .......................... H02M 5/00; H02M 11/00; H03K 17/04
(52) U.S. Cl. .......................... 363/157; 363/59; 327/103; 327/375
(58) Field of Search ................................ 363/157, 156, 363/147, 144, 59, 97, 73, 47; 323/312, 217, 315, 267, 290, 280, 224; 327/530, 109, 103, 100, 375, 260, 366

(56) References Cited
U.S. PATENT DOCUMENTS 5,184,027 A * 2/1993 Masuda et al. ............. 307/269
5,382,924 A * 1/1995 Pardoen et al. ............. 332/100
5,627,500 A * 5/1997 Wolaver et al. ............. 327/291
5,748,125 A * 5/1998 Cedebum et al. ........... 341/136

FOREIGN PATENT DOCUMENTS

JP    A 7-115328    5/1995

OTHER PUBLICATIONS

"A 0.9V 1.2mA 200MHz BiCMOS single–Chip Narrow–Band FM Receiver", Matthijs Pardoen et al., ISSCC Digest of Technical Papers, pp. 348–349, Feb., 1996, IEEE International Solid–State Circuits Conference.

* cited by examiner

Primary Examiner—Rajnikant B. Patel
(74) Attorney, Agent, or Firm—Burns, Doane, Swecker & Mathis, LLP

(57) ABSTRACT

There is provided a frequency voltage converter comprises a first transmission line for transmitting an input signal and a second transmission line provided with a delay line circuit, a third transmission line for transmitting a reference signal and a fourth transmission line provided with a delay line circuit, a mixer circuit, and a locked loop having a control circuit for outputting the same control signal to control portions of both delay line circuits so that the amount of a delay by the delay line circuit reaches one cycle of the reference signal, thereby holding linearity with respect to the frequency of a modulated wave signal and executing frequency voltage conversion even when a center frequency is low.

20 Claims, 5 Drawing Sheets

FREQUENCY VOLTAGE CONVERTER

BACKGROUND OF THE INVENTION

1. Field of the Invention

The present invention relates to a frequency voltage converter, and particularly to a frequency voltage converter capable of holding linearity with respect to a modulated wave signal in a wide frequency band.

2. Description of the Prior Art

FIG. 9 is a circuit diagram showing a configuration of a conventional frequency voltage converter employed in a demodulator circuit as to frequency modulating methods such as FM, FSK, GFSK, etc. In FIG. 9, reference numeral 101 indicates a mixer circuit for converting a modulated wave signal Vin having an intermediate frequency to a frequency voltage, reference numeral 102 indicates a first input terminal of the mixer circuit 101, reference numeral 103 indicates a second input terminal of the mixer circuit 102, reference numeral 104 indicates a first capacitor (capacitance C1) connected to a signal line which branches off toward the second input terminal 103, reference numeral 105 indicates a voltage source, reference numeral 106 indicates a second capacitor (capacitance C2), reference numeral 107 indicates an inductor (inductance L), and reference numeral 108 indicates a resistor (resistance value R), respectively. Further, Vout indicates a signal outputted from the mixer circuit 101.

The operation of the frequency voltage converter will be next described.

When the modulated wave signal Vin is inputted, the relationship between a DC output obtained by removing the harmonics of the output signal Vout, and the modulated wave signal Vin is represented by the following equation (1):

$$Vin(S)/Vout(S) \propto s^2 LC_2/s^2 L(C_1+C_2)+sL/R+1, (s=j\omega) \quad (1)$$

When the variables in equation (1) are defined as in the following equation (2), the equation (1) is converted to the following equation (3).

$$\omega_0 = 1/\sqrt{L(C_1+C_2)}, Q=R/\omega_0 L \quad (2)$$

$$Vout/Vin \propto \pi/2 - \tan^{-1}[Q(\omega/\omega_0 - \omega_0/\omega)] \quad (3)$$

$$\omega - \omega_0 << \omega_0/Q \quad (4)$$

As is derived from the above equation (3), the voltage of the output signal Vout results in one given as the function of a frequency $\omega$. Under the condition in equation (4) above, the relationship between a DC output of the output signal Vout and the frequency of the input signal Vin approaches a proportionality relation. The center frequency of the input signal Vin is matched with $\omega_0$ to thereby effect frequency voltage conversion on the input signal Vin.

The conventional frequency voltage converter is accompanied by a problem that since it is configured as described above, a Q value unavoidably results in a large value to maintain input amplitude at the second input terminal 103 where the center frequency $\omega_0$ is low with respect to a frequency deviation $(\omega-\omega_0)$, and hence the value of $(\omega_0/Q)$ becomes small, thereby incurring a difficult execution of frequency voltage conversion with holding linearity with respect to the frequency of the input signal Vin.

SUMMARY OF THE INVENTION

The present invention has been made to solve the above-described drawback. It is therefor an object to provide a frequency voltage converter capable of holding linearity with respect to the frequency of an input signal over a wide frequency band and thereby carrying out frequency voltage conversion.

According to a first aspect of the present invention, there is provided a frequency voltage converter comprising: a first transmission line comprised of one signal line which branches off from a signal line for transmitting an input signal corresponding to a modulated wave signal; a second transmission line comprised of the other signal line which branches off from the input signal transmitting signal line; a mixer circuit having a first input terminal connected to the first transmission line and a second input terminal connected to the second transmission line; a delay-amount variable first delay line circuit placed in the second transmission line between a portion where the first transmission line and the second transmission line branch off from each other and the second input terminal of the mixer circuit; a third transmission line comprised of one signal line which branches off from a signal line for transmitting a reference signal having a predetermined frequency; a fourth transmission line comprised of the other signal line which branches off from the reference signal transmitting signal line; a delay-amount variable second delay line circuit placed in the fourth transmission line between a portion where the third transmission line and the fourth transmission line branch off from each other and a portion where the third transmission line and the fourth transmission line are joined to each other; and delay amount control means connected to the third transmission line, the fourth transmission line, a control section of the first delay line circuit and a control section of the second delay line circuit and for outputting the same control signal to the control section of the second delay line circuit and the control section of the first delay line circuit so that the reference signal passing through the fourth transmission line is delayed by a predetermined cycle with respect to the reference signal passing through the third transmission line.

Here, the first delay line circuit may comprise a plurality of stages of unit delay circuits, the second delay line circuit comprises a plurality of stages of unit delay circuits, and the unit delay circuits constituting the first delay line circuit and the unit delay circuits constituting the second delay line circuit respectively have the same circuit configuration.

In addition, when the number of stage of the unit delay circuits series-connected in the first delay line circuit, the number of stage of the unit delay circuits series-connected in the second delay line circuit, the center frequency of the input signal, and the frequency of the reference signal are respectively defined as a, b, fc and fr, the numbers of stage for the first delay line circuit and the second delay line circuit may be respectively set so that a/b=fr/4fc is established, and the frequency of the reference signal may also be adjusted.

On the other hand, when the number of stages of the unit delay circuits series-connected in the first delay line circuit, the number of stages of the unit delay circuits series-connected in the second delay line circuit, the center frequency of the input signal, and the frequency of the reference signal are respectively defined as a, b, fc and fr, the numbers of the stages for the first delay line circuit and the second delay line circuit may be respectively set so that a/b=fr/2fc is established, and the frequency of the reference signal may also be adjusted.

Further, the frequency voltage converter may include: a first buffer and a second buffer disposed in order from the side close to the branch portion between the branch portion and the first input terminal of the mixer circuit in the first transmission line, a third buffer disposed between the branch portion and the first delay line circuit in the second transmission line, a fourth buffer disposed between the first delay line circuit and the second input terminal of the mixer circuit in the second transmission line, a fifth buffer and a sixth buffer disposed in order from the side close to the branch portion between the branch portion and the joined portion in the third transmission line, a seventh buffer disposed between the branch portion and the second delay line circuit in the fourth transmission line, and an eighth buffer disposed between the second delay line circuit and the joined portion in the fourth transmission line, wherein the first buffer, the third buffer, the fifth buffer and the seventh buffer respectively have the same circuit configuration as an output buffer of the each unit delay circuit, and the second buffer, the fourth buffer, the sixth buffer and the eighth buffer respectively have the same circuit configuration as an input buffer of the each unit delay circuit.

According to a second aspect of the present invention, there is provided a frequency voltage converter comprising: a first transmission line comprised of one signal line which branches off from a signal line for transmitting an input signal corresponding to a modulated wave signal; a second transmission line comprised of the other signal line which branches off from the input signal transmitting signal line; a mixer circuit having a first input terminal connected to the first transmission line and a second input terminal connected to the second transmission line; a delay-amount variable delay line circuit placed in the second transmission line between a portion where the first transmission line and the second transmission line branch off from each other and the second input terminal of the mixer circuit; a signal line for transmitting a reference signal having a predetermined frequency; a ring oscillator capable of varying an oscillation frequency; and delay amount control means connected to the signal line for transmitting the reference signal, a signal line for transmitting a signal outputted from the ring oscillator, and a control section of the delay line circuit and a control section of the ring oscillator and for outputting the same control signal to the control section of the ring oscillator and the control section of the delay line circuit so that the frequency of the signal outputted from the ring oscillator coincides with that of the reference signal, wherein the delay line circuit comprises a plurality of stages of unit delay circuits, the ring oscillator comprises a plurality of stages of unit delay circuits disposed in ring form, and the unit delay circuits constituting the delay line circuit and the unit delay circuits constituting the ring oscillator respectively have the same circuit configuration.

According to a third aspect of the present invention, there is provided a frequency voltage converter comprising: a first transmission line comprised of one signal line which branches off from a signal line for transmitting an input signal corresponding to a modulated wave signal; a second transmission line comprised of the other signal line which branches off from the input signal transmitting signal line; a mixer circuit having a first input terminal connected to the first transmission line and a second input terminal connected to the second transmission line; a delay-amount variable delay line circuit placed in the second transmission line between a portion where the first transmission line and the second transmission line branch off from each other and the second input terminal of the mixer circuit; a signal line for transmitting a reference signal having a predetermined frequency; a ring oscillator capable of varying an oscillation frequency; a divider for inputting a signal outputted from the ring oscillator; and delay amount control means connected to the signal line for transmitting the reference signal, a signal line for transmitting a signal outputted from the divider, and a control section of the delay line circuit and a control section of the ring oscillator and for outputting the same control signal to the control section of the ring oscillator and the control section of the delay line circuit so that the frequency of the signal outputted from the divider coincides with that of the reference signal, wherein the delay line circuit comprises a plurality of stages of unit delay circuits, the ring oscillator comprises a plurality of stages of unit delay circuits disposed in ring form, and the unit delay circuits constituting the delay line circuit and the unit delay circuits constituting the ring oscillator respectively have the same circuit configuration.

Here, each of delay-amount variable delay element circuits which are connected and provided by a predetermined number within the each unit delay circuit so as to constitute the unit delay circuit, may be a differential circuit provided with current amount control means and output amplitude control means.

Alternatively, each of delay-amount variable delay element circuits which are connected and provided by a predetermined number within the each unit delay circuit so as to constitute the unit delay circuit, may be configured so that amount-of-current control means are connected in series with CMOS inverter circuits.

Further, a phase detector having a first input terminal connected to the first transmission line and a second input terminal connected to the second transmission line may be disposed in place of the mixer circuit.

Furthermore, the phase detector may be a phase detecting circuit for detecting only delayed phase.

DETAILED DESCRIPTION OF THE PREFERRED EMBODIMENTS

An embodiment of the present invention will be described below.

Embodiment 1

Figure 1:
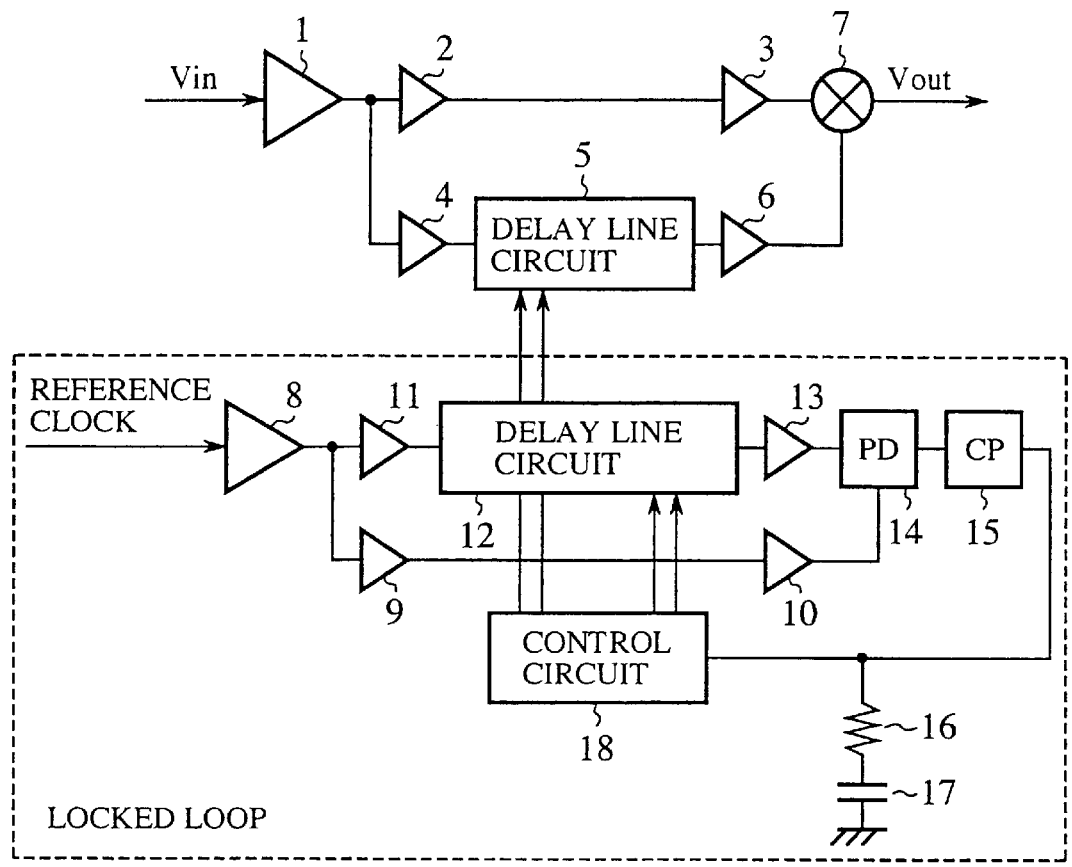
FIG. 1 is a circuit diagram showing a configuration of a frequency voltage converter according to a first embodiment of the present invention.

FIG. 1 is a circuit diagram showing a configuration of a frequency voltage converter according to a first embodiment of the present invention. In FIG. 1, reference numeral 1 indicates a buffer provided for a modulated wave signal having an intermediate frequency, reference numeral 2 indicates a buffer (first buffer) connected to one of signals lines that branch off from a signal line extending from the output of the buffer 1, reference numeral 3 indicates a buffer (second buffer) connected to a signal line extending from the output of the buffer 2, reference numeral 4 indicates a buffer (third buffer) which is connected to the other of the signal lines that branch off from the signal line extending from the output of the buffer 1 and which has the same circuit configuration as the buffer 2, reference numeral 5 indicates a delay line circuit (first delay line circuit) connected to a signal line extending from the output of the buffer 4, reference numeral 6 indicates a buffer (fourth buffer) which is connected to a signal line extending from the output of the delay line circuit 5 and has the same circuit configuration as the buffer 3, reference numeral 7 indicates a mixer circuit having a first input terminal to which a signal outputted from the buffer 3 is inputted and a second input terminal to which a signal outputted from the buffer 6 is inputted, reference numeral 8 indicates a buffer provided for a reference clock signal (reference signal), reference numeral 9 indicates a buffer (fifth buffer) which is connected to one of signals lines that branch off from a signal line extending from the output of the buffer 8 and has the same circuit configuration as the buffer 2, reference numeral 10 indicates a buffer (sixth buffer) connected to a signal line extending from the output of the buffer 9 and having the same circuit configuration as the buffer 3, reference numeral 11 indicates a buffer (seventh buffer) which is connected to the other of the signal lines that branch off from the signal line extending from the output of the buffer 8 and which has the same circuit configuration as the buffer 2, reference numeral 12 indicates a delay line circuit (second delay line circuit) connected to a signal line extending from the output of the buffer 11, reference numeral 13 indicates a buffer (eighth buffer) which is connected to a signal line extending from the output of the delay line circuit 12 and has the same circuit configuration as the buffer 3, reference numeral 14 indicates a phase comparator or detector having a first input terminal to which a signal outputted from the buffer 10 is inputted, and a second input terminal to which a signal outputted from the buffer 13 is inputted, reference numeral 15 indicates a charge pump which is connected to the phase detector 14 and changes the voltage of a signal to be outputted to a control circuit (depicted later) according to the result of comparison, reference numeral 16 indicates a resistor, reference numeral 17 indicates a capacitor, and reference numeral 18 indicates the control circuit which is operated so as to take the matching between an output voltage of a loop filter comprised of the resistor 16 and the capacitor 17 and an input voltage of the delay line circuit 12 to thereby output a control signal to each of the first delay line circuit 5 and the second delay line circuit 12.

Incidentally, a path which extends through the buffer 2 and the buffer 3, a path which extends through the buffer 4, delay line circuit 5 and buffer 6, a path which extends through the buffers 9 and 10, and a path which extends through the buffer 11, delay line circuit 12 and buffer 13 are respectively defined as a first transmission line, a second transmission line, a third transmission line and a fourth transmission line in the frequency voltage converter having the above circuit configuration. The first delay line circuit 5 and the second delay line circuit 12 respectively comprise a plurality of stages of unit delay circuits, each of which has the same circuit configuration. The delay line circuit 12, the phase detector 14, the charge pump 15, the loop filter, the control circuit 18, and so on constitute a locked loop for locking a signal passing through the fourth transmission line to a reference signal passing through the third transmission line. Further, the phase detector 14, charge pump 15, loop filter and control circuit 18 function as delay amount control means for delaying the reference clock signal passing through the fourth transmission line including the delay line circuit 12 by one cycle (or ½ cycle) with respect to the reference clock signal passing through the third transmission line and delaying an input signal passing through the second transmission line including the delay line circuit 5 by a predetermined cycle with respect to an input signal passing through the first transmission line. In order to lock the reference clock signal passing through the fourth transmission line including the delay line circuit 12 so as to be delayed by one cycle with respect to the reference clock signal passing through the third transmission line, the control circuit 18 effects polarity inversion, level shifting, and the like on a signal outputted from the loop filter. The execution of the polarity inversion makes it possible to perform polarity matching so that the locked loop is brought to negative feedback. The execution of the level shifting makes it possible to bring central bias levels into matching so that even if variations in components take place, they fall within a variable delay range of each delay line circuit.

The operation of the frequency voltage converter will be next described.

When a limited modulated wave signal is inputted to the buffer 1, the following equation (5) is established between the modulated wave signal Vin given as an input signal and a signal Vout outputted from the mixer circuit 7.

$$\text{Vout/vin} \propto \tau/T/2 - 2\tau(fc+\Delta f) \tag{5}$$

In the above equation (5), $\tau$ indicates the amount of a delay developed by the delay line circuit 5, T indicates the cycle of the input signal, fc indicates the center frequency of the input signal, and $\Delta f$ indicates the deviation of the frequency of the input signal from the center frequency fc, respectively. As is apparent from the equation (5), a DC output voltage (corresponding to one obtained by removing harmonic components of Vout) proportional to the frequency of the input signal can be obtained. The amount of the delay $\tau$ developed by the delay line circuit 5 is generally set to a ¼ cycle of a signal having the center frequency fc of the input signal. In this case, the equation (5) is substituted with the equation (6).

$$\text{Vout/Vin} \propto \tfrac{1}{4} fc/\tfrac{1}{2}(fc+\Delta f) = 1 + \Delta f/fc/2 \tag{6}$$

As is apparent from the equation (6), the center value results in ½ when the amount of the delay is set to the ¼ cycle, i. e., a differential pair is brought into an equilibrium state as for the differential pair. Therefore, an advantage is obtained in that, for example, an input frequency range can be increased and an offset on using a differential circuit can be reduced.

The locked loop locks the amount of a delay by the delay line circuit 12 so as to reach one cycle of the reference clock signal. As already mentioned above, the first delay line circuit 5 and the second delay line circuit 12 are configured so as to have the same unit delay circuits in plural stages respectively. The common control signal is inputted to the first delay line circuit 5 and the second delay line circuit 12.

Thus, the amount of the delay by the first delay line circuit 5 results in a value proportional to the ratio between the number of the stages included in the first delay line circuit 5 and the number of the stages included in the second delay line circuit 12. Since each of the first delay line circuit 5 and the second delay line circuit 12 has such a configuration as described above, relative variations in components (such as a transistor, a resistor and a capacitor) in an integrated circuit formed on the same chip are so low even where absolute variations occur in components due to a wafer process or the like. Therefore, the delay amount in a locked state has no relation to the characteristic of each component. Thus, the delay amount of the first delay line circuit 5 is kept constant without any change and an output offset becomes so small.

If the frequency of the reference clock signal is defined as fr (Hz) to set the delay amount of the first delay line circuit 5 to the ¼ cycle of the signal having the center frequency fc (Hz) of the modulated wave signal, the following equation (7) is established between the number of the stages for the first delay line circuit 5 and the number of the stages for the second delay line circuit 12.

(Number of stages for first delay line circuit)/(Number of stages for second delay line circuit)=$fr/4fc$ (7)

Further, when a duty ratio of the reference clock signal is 50%, the output signal of the delay line circuit 12 is locked in anti-phase and thereby the delay amount of the delay line circuit 12 can also be set to a half cycle of the reference clock signal. In this case, in order to set the delay amount to the ¼ cycle of the signal having the center frequency fc, the following equation (8) is established between the number of the stages for the first delay line circuit 5 and the number of the stages for the second delay line circuit 12.

(Number of stages for first delay line circuit)/(Number of stages for second delay line circuit)=$fr/2fc$ (8)

It is thus possible to reduce the number of the stages for the second delay line circuit 12 to half, reduce power consumption and decrease an area occupied by the second delay line circuit 12 on the chip.

Further, the frequency voltage converter according to the first embodiment can also obtain a DC output voltage (one obtained by removing harmonic components of Vout) through the use of a phase detector in place of the mixer circuit 7 to basically operate according to a digital signal except for a circuit portion having a locking function in the locked loop. This phase detector is substituted by another phase detector for detecting only the delay of phase for the purpose of reducing a circuit scale.

Figure 2:
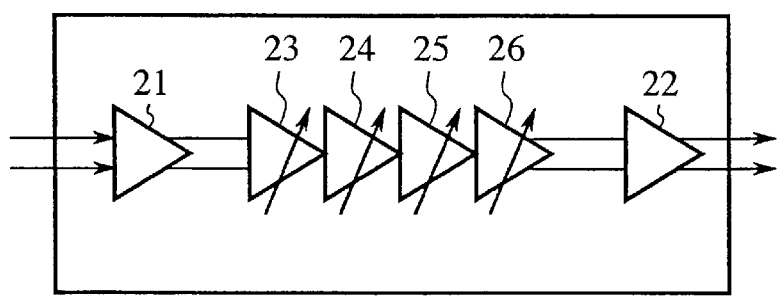
FIG. 2 is a circuit diagram illustrating an example of a unit delay circuit employed in the first embodiment of the present invention.

FIG. 2 is a circuit diagram showing an example of one of unit delay circuits which constitute a delay line circuit employed in the first embodiment of the present invention. In FIG. 2, reference numeral 21 indicates an input buffer having the same circuit configuration as the buffer 3 placed in the input stage of the unit delay circuit, reference numeral 22 indicates an output buffer placed in the output stage of the unit delay circuit and having the same circuit configuration as the buffer 2, and reference numerals 23, 24, 25 and 26 respectively indicate delay element circuits each capable of changing the delay amount according to a control signal sent from the control circuit 18. Incidentally, the number of the delay element circuits is not limited to four as shown in FIG. 2 and may be set in response to desired circuit characteristics required for the unit delay circuit. Each of the input buffer 21 and the output buffer 22 serves so as to reduce the output-load dependency of the unit delay circuit with its input/output impedance and output amplitude being kept constant.

Figure 3:
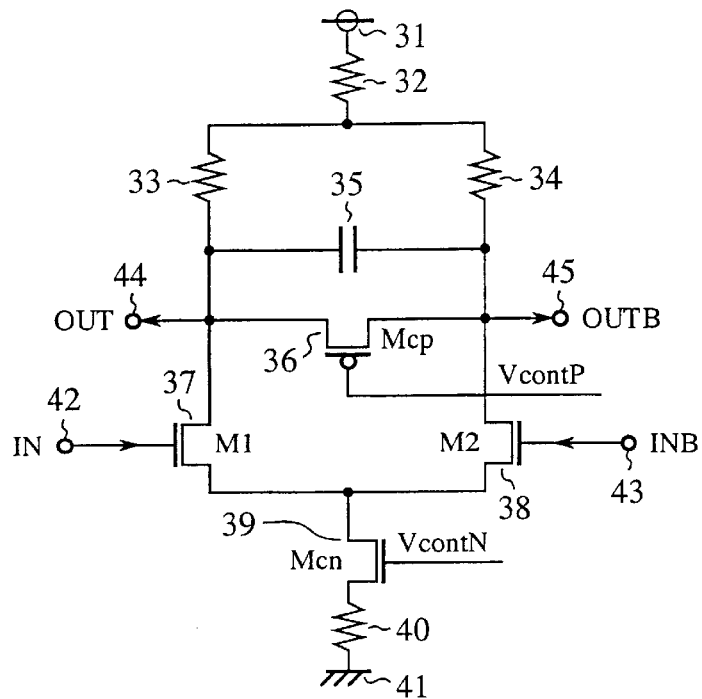
FIG. 3 is a circuit diagram depicting one example of a delay element circuit employed in the first embodiment of the present invention.

FIG. 3 is a circuit diagram showing one example of the delay element circuit which constitutes the unit delay circuit employed in the first embodiment of the present invention. In FIG. 3, reference numeral 31 indicates a voltage source, reference numerals 32, 33 and 34 indicate resistors, reference numeral 35 indicates a capacitor, reference numeral 36 indicates a P channel transistor, reference numerals 37, 38 and 39 indicate N channel transistors, reference numeral 40 indicates a resistor, reference numeral 41 indicates a ground, reference numeral 42 indicates one input terminal of a differential input, reference numeral 43 indicates the other input terminal of the differential input, reference numeral 44 indicates one output terminal of a differential output, and reference numeral 45 indicates the other output terminal of the differential output, respectively. Incidentally, the N channel transistor 39 having a gate to which a control voltage $V_{contN}$ is inputted, functions as current amount control means for adjusting the amount of a current flowing in the circuit shown in FIG. 3. Further, the P channel transistor 36 having a gate to which a control voltage $V_{contP}$ is inputted, functions as output amplitude control means for adjusting the amplitude of an output.

The operation of the delay element circuit shown in FIG. 3 will be next described.

Figure 4:
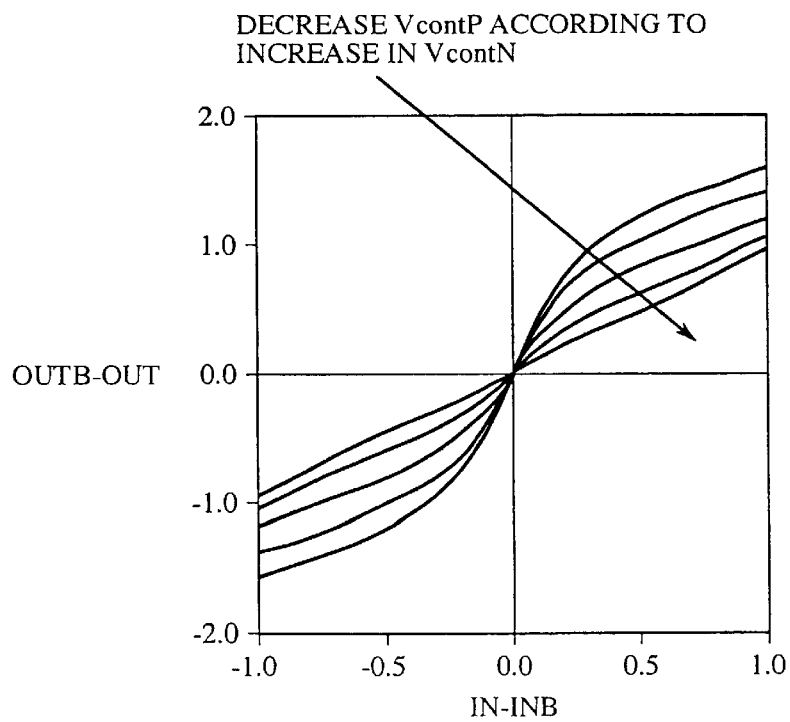
FIG. 4 is a diagram showing changes in input/output DC characteristics corresponding to control of control voltages used in the unit delay circuit.

When the control voltage $V_{contN}$ applied to the gate of the N channel transistor 39 is raised, then the amount of a current flowing through the delay element circuit increases. At this time, when the control voltage $V_{contP}$ applied to the gate of the P channel transistor 36 is lowered according to the increase in the current amount, then the output amplitude becomes small. When the output amplitude is reduced upon increase of the current amount flowing through the delay element circuit, then the amount of a delay by the delay element circuit becomes small. In such a way, controlling the control voltages $V_{contN}$ and $V_{contP}$ can yield a change in the delay amount. FIG. 4 is a diagram showing changes in input-output DC characteristics when control voltages are controlled in the above-described manner.

Figure 5:
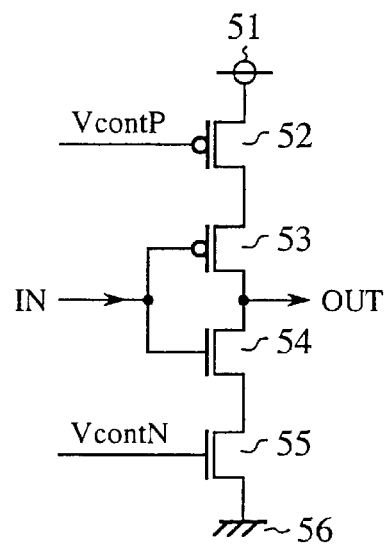
FIG. 5 is a circuit diagram illustrating another example of the delay element circuit employed in the first embodiment of the present invention.

FIG. 5 is a circuit diagram showing another example of the delay element circuit which constitutes the unit delay circuit employed in the first embodiment of the present invention. In FIG. 5, reference numeral 51 indicates a voltage source, reference numerals 52 and 53 indicate P channel transistors, reference numerals 54 and 55 indicate N channel transistors, and reference numeral 56 indicates a ground, respectively. Incidentally, the N channel transistor 55 having a gate to which a control voltage $V_{contN}$ is inputted, and the P channel transistor 52 having a gate to which a control voltage $V_{contP}$ is inputted, function as current amount control means for adjusting the amount of a through current flowing through the delay element circuit shown in FIG. 5.

The operation of the delay element circuit shown in FIG. 5 will be next described.

In the circuit shown in FIG. 5, the amplitude of an output thereof becomes constant. On the other hand, when the control voltage $V_{contN}$ applied to the gate of the N channel transistor 55 is raised and the control voltage $V_{contP}$ applied to the gate of the P channel transistor 52 is lowered to increase the amount of a through current that flows when the voltage of an input signal changes, the delay amount by the delay element circuit becomes low. Controlling the control voltages $V_{contN}$ and $V_{contP}$ in this way can yield a change in the delay amount.

Figure 6:
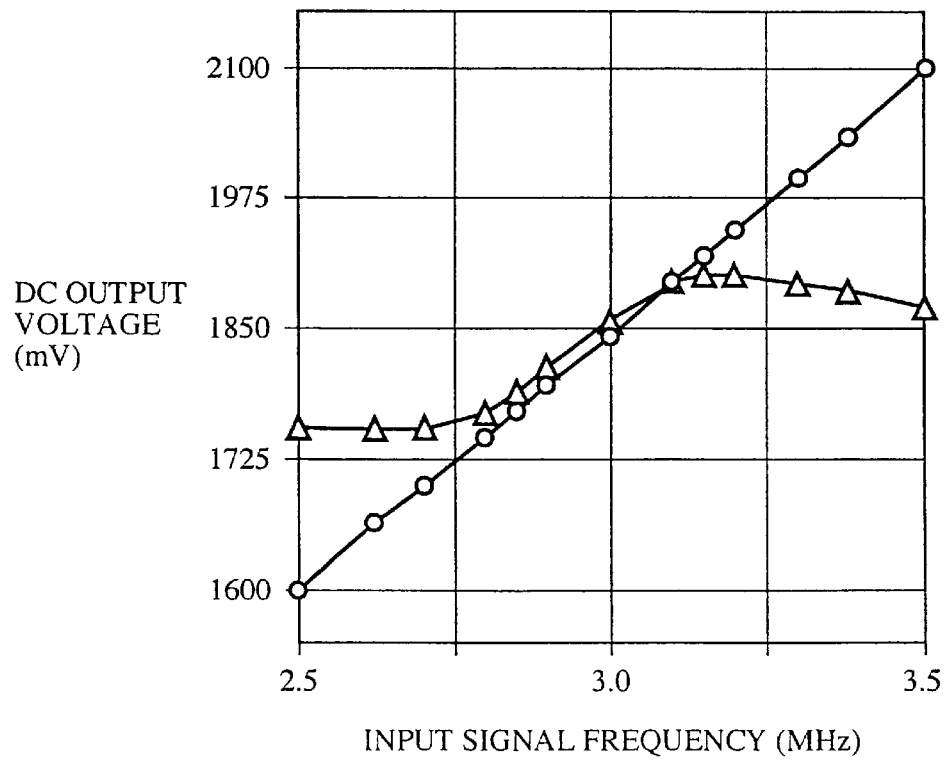
FIG. 6 is a diagram depicting the relationship between the frequency of a signal inputted to the frequency voltage converter and a DC output voltage of a signal outputted therefrom.

The characteristics of the frequency voltage converter according to the first embodiment of the present invention will be next described. FIG. 6 is a diagram showing the relationship between the frequencies of signals inputted to the frequency voltage converter according to the first embodiment of the present invention and the conventional frequency voltage converter and DC output voltages of signals outputted from both. In FIG. 6, a curve formed by connecting O marks indicates a frequency voltage conversion characteristic of the frequency voltage converter according to the first embodiment of the present invention, and a curve formed by connecting Δ marks indicates a frequency voltage conversion characteristic of the conventional frequency voltage converter. As shown in FIG. 6, the frequency voltage converter according to the first embodiment of the present invention can hold linearity between the frequency of the input signal and the output voltage in a wider frequency band as compared with the conventional frequency voltage converter.

According to the first embodiment as described above, the frequency voltage converter is provided with the first transmission line, the second transmission line having the delay line circuit 5, the mixer circuit 7 disposed at the portion where the first transmission line and the second transmission line are joined to each other, the third transmission line, the fourth transmission line having the delay line circuit 12, and the delay amount control means (phase comparator or detector 14, charge pump 15, loop filter and control circuit 18) for outputting the same control signal to the corresponding control unit of the delay line circuit 12 and the corresponding control unit of the delay line circuit 5 so that the reference signal passing through the fourth transmission line is delayed by one cycle with respect to the reference signal passing through the third transmission line. Accordingly, the input signal passing through the second transmission line can be delayed by a predetermined cycle with respect to the input signal passing through the first transmission line by suitably controlling the frequency of the reference signal regardless of the magnitude of the center frequency of the input signal when the delay line circuit 5 and the delay line circuit 12 are configured so that a predetermined correlation is established between the delay amount of the delay line circuit 5 and the delay amount of the delay line circuit 12 upon inputting of the same control signal, thus making it possible to hold linearity with respect to the frequency of the input signal in the wide frequency band and execute frequency voltage conversion.

Further, since the delay line circuit 5 comprises the plurality of stages of unit delay circuits, the delay line circuit 12 comprises the plurality of stages of unit delay circuits, and the unit delay circuits constituting the delay line circuit 5 and the unit delay circuits constituting the delay line circuit 12 are identical in circuit configuration to one another, the delay amount developed in the second transmission line can accurately be set as a value proportional to the ratio between the number of the stages included in the delay line circuit 5 and the number of the stages included in the delay line circuit 12, thus executing linear transformation of the frequency voltage converter with higher accuracy.

Further, when the number of the stages of the unit delay circuits series-connected in the delay line circuit 5, the number of the stages of the unit delay circuits series-connected in the delay line circuit 12, the center frequency of the input signal, and the frequency of the reference signal are respectively defined as a, b, fc and fr, the numbers of stage for the delay line circuit 5 and the delay line circuit 12 are respectively set so that a/b=fr/4fc is established, and the frequency of the reference clock signal is adjusted. In such a way, the delay amount developed in the second transmission line may be brought to the ¼ cycle of the signal having the center frequency of the input signal, thereby applying easily the circuit, enlarging the frequency range of the input signal and reducing the offset upon using of the differential circuit.

Further, since the numbers of stage for the delay line circuit 5 and the delay line circuit 12 are respectively set so that a/b=fr/2fc is established, based on variable definition similar to the above, and the frequency of the reference clock signal is adjusted, the output signal of the delay line circuit 12 is locked in antiphase and thereby the amount of the delay by the delay line circuit 12 can be set to the half cycle of the reference clock signal when the duty ratio of the reference clock signal is given as 50%, whereby the number of stage for the delay line circuit 12 can be reduced to half, thereby enabling the reduction in power consumption and the reduction in the area occupied by the delay line circuit 12 on the chip.

Further, since the buffer 2, buffer 4, buffer 9 and buffer 11 each have the same circuit configuration as the output buffer of the unit delay circuit, and the buffer 3, buffer 6, buffer 10 and buffer 13 each have the same circuit configuration as the input buffer of the unit delay circuit, the input and output impedance, input and output amplitude and so on related to the delay line circuits 5 and 12 can be unified, and the difference between the delay amounts developed in the input and output buffers of the delay line circuits 5 and 12 can be reduced, thus executing linear transformation of the frequency voltage converter with higher accuracy.

Further, since the delay element circuit is configured as the differential circuit provided with the current amount control means given as the N channel transistor 39 and the output amplitude control means given as the P channel transistor 36, the middle point between high and low levels of the signal inputted to the delay element circuit is brought into the equilibrium state of the differential pair, resulting in performing an easy application of the circuit.

Further, since the current amount control means given as the N channel transistor 55 and the P channel transistor 52 are series-connected to the CMOS inverter circuits 53 and 54 to constitute the delay element circuit, a change in the delay amount of the delay element circuit can be boosted, thereby enlarging the variable delay ranges of the delay line circuits 5 and 12.

Further, since the phase detector is disposed in place of the mixer circuit 7, a digital signal process can be effected on the input signal corresponding to the modulated wave signal, thereby enhancing the accuracy of an output voltage obtained by frequency voltage conversion as compared with an analog signal process.

Furthermore, the phase detector is configured as a phase detecting circuit for detecting only delayed phase, which permits the scale reduction of the phase detecting circuit, thereby reducing the area occupied by the phase detector on the chip.

Embodiment 2

Figure 7:
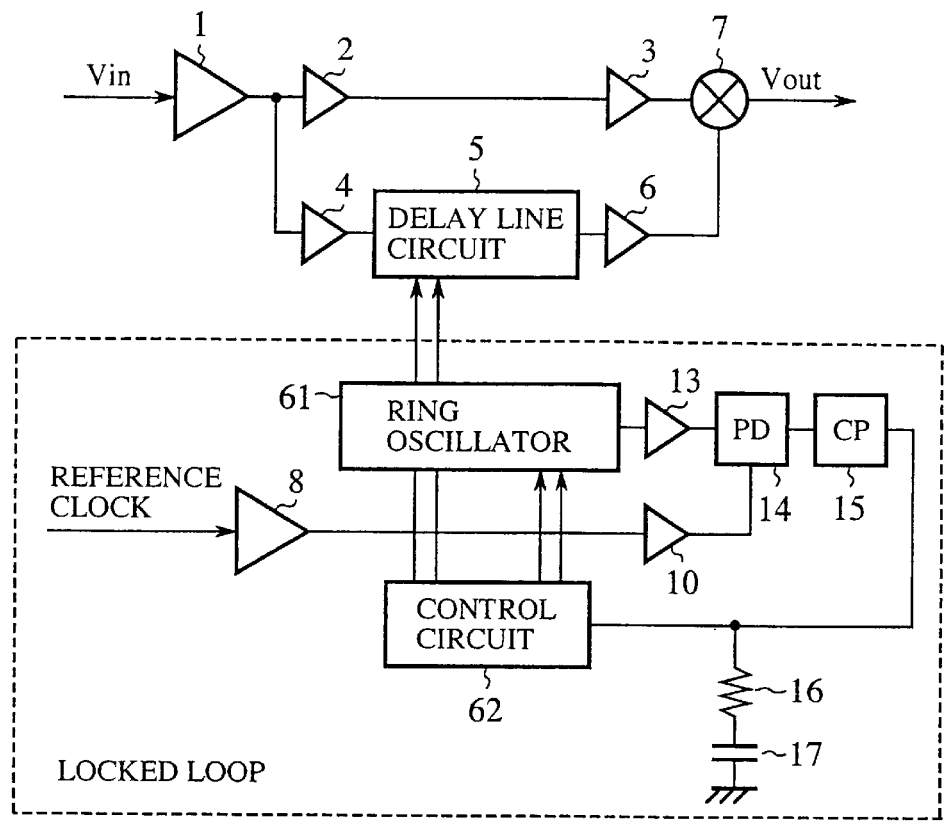
FIG. 7 is a circuit diagram showing a configuration of a frequency voltage converter according to a second embodiment of the present invention.
Figure 9:
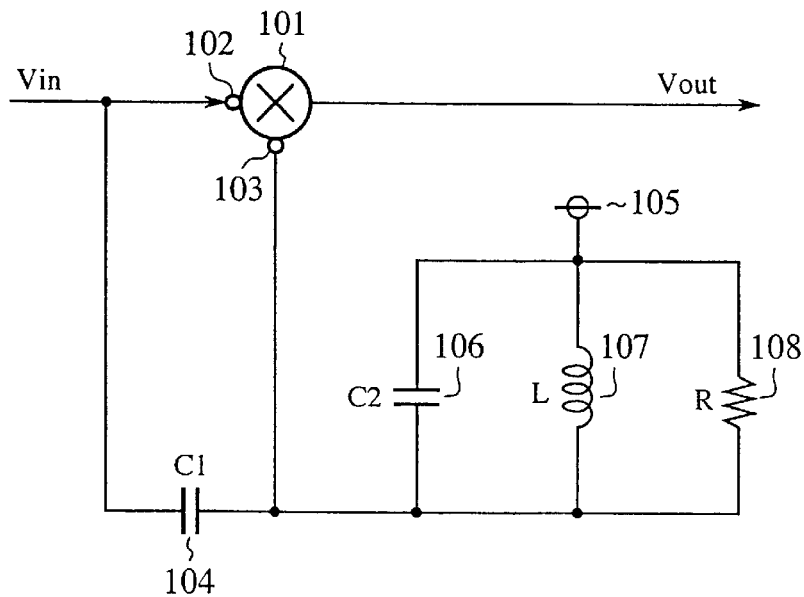
FIG. 9 is a circuit diagram depicting a configuration of a conventional frequency voltage converter.

FIG. 7 is a circuit diagram showing a configuration of a frequency voltage converter according to a second embodiment of the present invention. In FIG. 7, the same reference numerals as those shown in FIG. 1 indicate the same or corresponding portions respectively and the description thereof will therefore be omitted. Reference numeral 61 indicates a ring oscillator wherein unit delay circuits each having the same circuit configuration as each of unit delay circuits constituting a delay line circuit 5 are connected in plural stages in a ring-line arrangement, and reference numeral 62 indicates a control circuit electrically connected to a control unit of the delay line circuit 5 and a control unit of the ring oscillator 61 so as to operate in a manner similar to the control circuit 18. A reference clock (reference signal) is inputted to a first input terminal of a phase comparator or detector 14 through a buffer 8 and a buffer 10. A signal outputted from the ring oscillator, which functions as an oscillator, is inputted to a second input terminal of the phase detector 14 through a buffer 13.

Incidentally, a path which extends through a buffer 2 and a buffer 3, and a path which extends through a buffer 4, the delay line circuit 5 and a buffer 6 are respectively defined as a first transmission line, and a second transmission line in the frequency voltage converter having the above circuit configuration. The ring oscillator 61, phase detector 14, charge pump 15, loop filter, control circuit 62, and so on constitute a locked loop for locking the signal outputted from the ring oscillator 61 to the reference signal. Further, the phase detector 14, charge pump 15, loop filter and control circuit 62 function as delay amount control means for causing the frequency of the output signal of the ring oscillator 61 to coincide with that of the reference signal and delaying an input signal passing through the second transmission line including the delay line circuit 5 by a predetermined cycle with respect to the input signal passing through the first transmission line.

The operation of the frequency voltage converter will be next described.

The locked loop locks the signal outputted from the ring oscillator 61 used as an oscillator to the reference clock signal. Namely, the delay amount at the full circle of a plurality of stages of unit delay circuits shaped in ring form, which constitute the ring oscillator 61, is controlled so as to correspond to one cycle of the reference clock signal. As mentioned above, the delay line circuit 5 and the ring oscillator 61 each are configured with the unit delay circuit having the same circuit configuration. A common control signal is inputted to each of the delay line circuit 5 and the ring oscillator 61. Thus, the delay amount of the delay line circuit 5 results in a value proportional to the ratio between the number of stage included in the delay line circuit 5 and the number of stage included in the ring oscillator 61. Since each of the delay line circuit 5 and the ring oscillator 61 has such a configuration as described above, relative variations in components in an integrated circuit formed on the same chip are very small even when absolute variations occur in components due to wafer processes or the like. Therefore, the delay amount in a locked state has no relation to the characteristic of each component. Thus, the delay amount of the delay line circuit 5 is kept constant without any change and an output offset becomes very small.

According to the second embodiment as described above, the frequency voltage converter is provided with the first transmission line, the second transmission line having the delay line circuit 5, a mixer circuit 7 disposed at a portion where the first transmission line and the second transmission line are joined to each other, the ring oscillator 61 in which the unit delay circuit having the same circuit configuration as the unit delay circuit constituting the delay line circuit 5 are placed in ring form, and the delay amount control means (phase detector 14, charge pump 15, loop filter and control circuit 62) for outputting the same control signal to a control unit of the ring oscillator 61 and a control unit of the delay line circuit 5 so that the frequency of the signal outputted from the ring oscillator 61 coincides with that of the reference signal. Thus, on inputting of the same control signal, the delay amount in the second transmission line can be accurately set as the value proportional to the ratio between the number of stage included in the delay line circuit 5 and the number of stage included in the ring oscillator 61, and the input signal passing through the second transmission line can be delayed by a predetermined cycle with respect to the input signal passing through the first transmission line by suitably adjusting the frequency of the reference clock signal, regardless of the magnitude of the center frequency of the input signal, thereby holding linearity with respect to the frequency of the input signal in a wide frequency band and executing frequency voltage conversion.

Further, the ring oscillator is applied easily and commonly used as compared with the delay line circuit, there is a high probability that past aspects of design accumulated may be adapted to the instant situation, thus allowing more efficient circuit design.

Incidentally, such a differential circuit as shown in FIG. 3 as the delay element circuit may be used even in the second embodiment in a manner similar to the first embodiment. The CMOS inverter circuits which are connected in series by the current amount control means as shown in FIG. 5 may be used as the delay element circuit. Further, a phase detector may be disposed in place of the mixer circuit 7. Even when the selection or change of the above-described component elements is effected on the frequency voltage converter according to the second embodiment of the present invention, an effect similar to that obtained in the first embodiment can be obtained.

Embodiment 3

Figure 8:
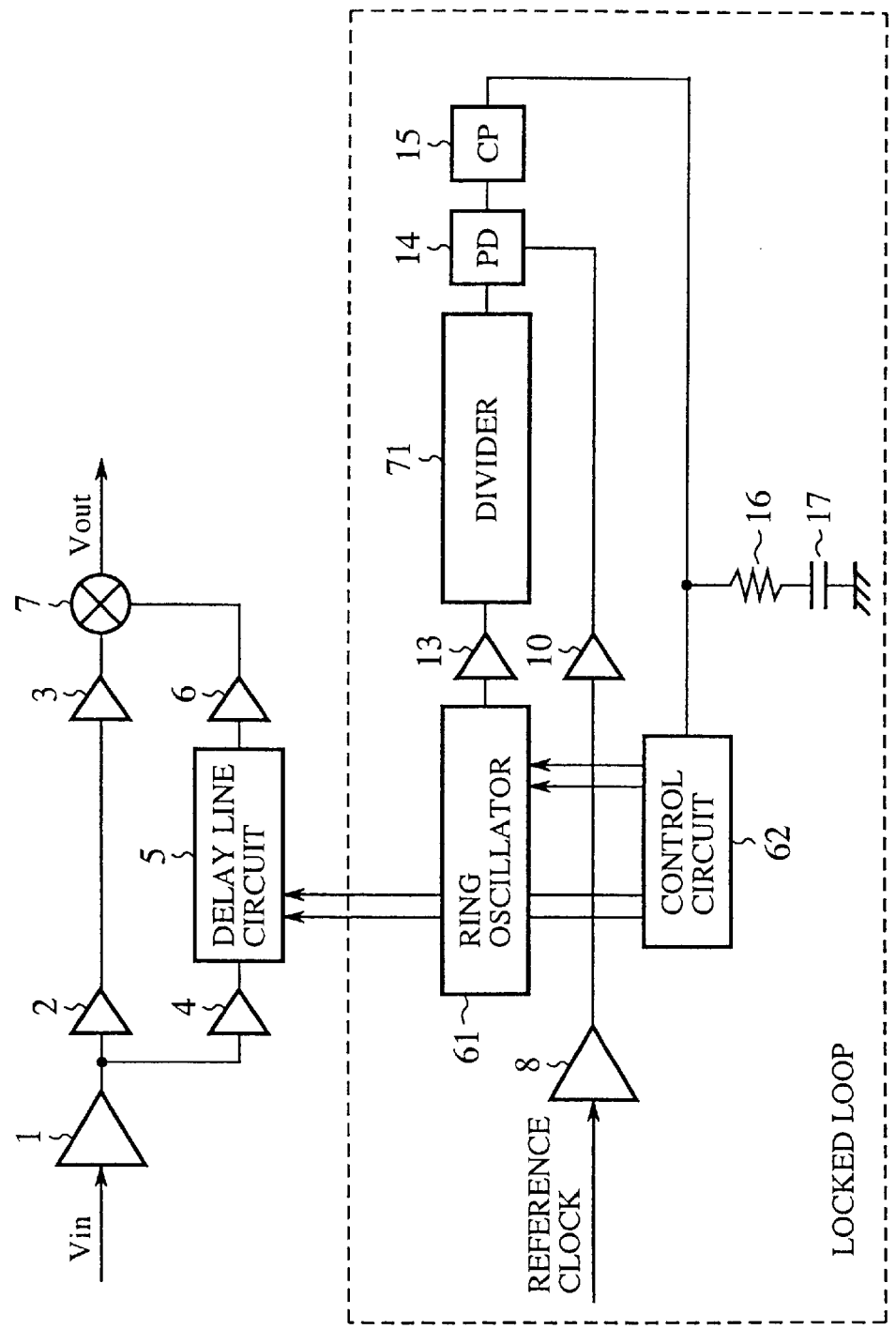
FIG. 8 is a circuit diagram illustrating a configuration of a frequency voltage converter according to a third embodiment of the present invention.

FIG. 8 is a circuit diagram showing a configuration of a frequency voltage converter according to a third embodiment of the present invention. In FIG. 8, the same reference numerals as those shown in FIGS. 1 and 7 indicate the same or corresponding portions respectively and the description thereof will therefore be omitted. Reference numeral 71 indicates a divider which inputs a signal outputted from a ring oscillator 61 through a buffer 13 and performs frequency conversion on the input signal, based on a predetermined division ratio. A reference clock signal (reference signal) is inputted to a first input terminal of a phase comparator or detector 14 through a buffer 8 and a buffer 10, and a signal outputted from the divider 71 is inputted to a second input terminal of the phase detector 14.

Incidentally, a path which extends through a buffer 2 and a buffer 3, and a path which extends through a buffer 4, a delay line circuit 5 and a buffer 6 are respectively defined as a first transmission line, and a second transmission line in the frequency voltage converter having the above circuit configuration. The ring oscillator 61, divider 71, phase detector 14, charge pump 15, loop filter, control circuit 62, etc. constitute a locked loop for locking the signal outputted from the divider 71 to the reference signal. Further, the phase detector 14, charge pump 15, loop filter and control circuit 62 function as delay amount control means for causing the frequency of the output signal of the divider 71 to coincide with that of the reference clock signal and delaying an input signal passing through the second transmission line including the delay line circuit 5 by a predetermined cycle with respect to the input signal passing through the first transmission line.

The operation of the frequency voltage converter will be next described.

The locked loop locks the signal outputted from the divider 71 to the reference clock signal. Namely, a delay amount obtained by multiplying the delay amount on passing an entire circle of a plurality of stages of unit delay circuits shaped in ring form, constituting the ring oscillator 61, by a division ratio (e.g., four times in the case of a four-division type divider) is controlled so as to reach one cycle of the reference clock signal. The delay line circuit 5 and the ring oscillator 61 each are configured so as to have unit delay circuits with plural stages each having the same circuit configuration. A common control signal is inputted to each of the delay line circuit 5 and the ring oscillator 61. Thus, the delay amount of the delay line circuit 5 results in a value proportional to the ratio between the number of stage included in the delay line circuit 5 and the number of the stages included in the ring oscillator 61. Since each of the delay line circuit 5 and the ring oscillator 61 has such a configuration as described above, the delay amount of the delay line circuit 5 is kept constant without any change and an output offset becomes very small, as described above in the second embodiment.

According to the third embodiment as described above, the frequency voltage converter is provided with the first transmission line, the second transmission line having the delay line circuit 5, a mixer circuit 7 disposed at a portion where the first transmission line and the second transmission line are joined to each other, the ring oscillator 61 in which the unit delay circuits each having the same circuit configuration as each of the unit delay circuits constituting the delay line circuit 5, are placed in ring form, the divider 71 which inputs a signal outputted from the ring oscillator 61, and the delay amount control means (phase detector 14, charge pump 15, loop filter and control circuit 62) for outputting the same control signal to a control unit of the ring oscillator 61 and a control unit of the delay line circuit 5 so that the frequency of the signal outputted from the divider 71 coincides with that of the reference clock signal. Accordingly, on inputting of the same control signal, the delay amount in the second transmission line can be accurately set as the value proportional to the ratio between the number of stage included in the delay line circuit 5 and the number of stage included in the ring oscillator 61, and the input signal passing through the second transmission line can be delayed by a predetermined cycle with respect to the input signal passing through the first transmission line by suitably adjusting the frequency of the reference clock signal, regardless of the magnitude of the center frequency of the input signal, thereby holding linearity with respect to the frequency of the input signal in a wide frequency band and executing frequency voltage conversion.

In addition, by preparing the divider 71, a combination of the ring oscillator 61 which oscillates at a high frequency, and the divider 71, rather than the formation of the ring oscillator 61 which oscillates at a low frequency, possibly decreasing a circuit scale when a reference clock signal having a low frequency is required, thereby achieving efficient utilization of a chip surface at will.

Incidentally, such a differential circuit as shown in FIG. 3 as the delay element circuit may be used even in the third embodiment in a manner similar to the first embodiment. The CMOS inverter circuits to which such current amount control means as shown in FIG. 5 are connected in series, may be used as the delay element circuit. Further, a phase detector may be disposed in place of the mixer circuit 7. Even when the selection or change of the above-described component elements is effected on the frequency voltage converter according to the third embodiment of the present invention, an effect similar to that obtained in the first embodiment can be obtained.

What is claimed is:

1. A frequency voltage converter comprising:
   a first transmission line comprised of one signal line which branches off from a signal line for transmitting an input signal corresponding to a modulated wave signal;

a second transmission line comprised of the other signal line which branches off from said input signal transmitting signal line;

a mixer circuit having a first input terminal connected to said first transmission line and a second input terminal connected to said second transmission line;

a delay-amount variable first delay line circuit placed in said second transmission line between a portion where said first transmission line and said second transmission line branch off from each other and the second input terminal of said mixer circuit;

a third transmission line comprised of one signal line which branches off from a signal line for transmitting a reference signal having a predetermined frequency;

a fourth transmission line comprised of the other signal line which branches off from said reference signal transmitting signal line;

a delay-amount variable second delay line circuit placed in said fourth transmission line between a portion where said third transmission line and said fourth transmission line branch off from each other and a portion where said third transmission line and said fourth transmission line are joined to each other; and delay amount control means connected to said third transmission line, said fourth transmission line, a control section of said first delay line circuit and a control section of said second delay line circuit and for outputting the same control signal to the control section of said second delay line circuit and the control section of said first delay line circuit so that the reference signal passing through said fourth transmission line is delayed by a predetermined cycle with respect to the reference signal passing through said third transmission line.

2. The frequency voltage converter according to claim 1, wherein said first delay line circuit comprises a plurality of stages of unit delay circuits, said second delay line circuit comprises a plurality of stages of unit delay circuits, and the unit delay circuits constituting said first delay line circuit and the unit delay circuits constituting the second delay line circuit respectively have the same circuit configuration.

3. The frequency voltage converter according to claim 2, wherein when the number of stage of the unit delay circuits series-connected in said first delay line circuit, the number of stage of the unit delay circuits series-connected in said second delay line circuit, the center frequency of the input signal, and the frequency of the reference signal are respectively defined as a, b, fc and fr, the numbers of stage for said first delay line circuit and said second delay line circuit are respectively set so that a/b=fr/4fc is established, and the frequency of the reference signal is adjusted.

4. The frequency voltage converter according to claim 2, wherein when the number of stages of the unit delay circuits series-connected in said first delay line circuit, the number of stages of the unit delay circuits series-connected in said second delay line circuit, the center frequency of the input signal, and the frequency of the reference signal are respectively defined as a, b, fc and fr, the numbers of the stages for said first delay line circuit and said second delay line circuit are respectively set so that a/b=fr/2fc is established, and the frequency of the reference signal is adjusted.

5. The frequency voltage converter according to claim 2, further including:
   a first buffer and a second buffer disposed in order from the side close to the branch portion between the branch portion and the first input terminal of said mixer circuit in said first transmission line, a third buffer disposed between the branch portion and said first delay line circuit in said second transmission line, a fourth buffer disposed between said first delay line circuit and the second input terminal of said mixer circuit in said second transmission line, a fifth buffer and a sixth buffer disposed in order from the side close to the branch portion between the branch portion and the joined portion in said third transmission line, a seventh buffer disposed between the branch portion and said second delay line circuit in said fourth transmission line, and an eighth buffer disposed between said second delay line circuit and the joined portion in said fourth transmission line, wherein said first buffer, said third buffer, said fifth buffer and said seventh buffer respectively have the same circuit configuration as an output buffer of said each unit delay circuit, and said second buffer, said fourth buffer, said sixth buffer and said eighth buffer respectively have the same circuit configuration as an input buffer of said each unit delay circuit.

6. A frequency voltage converter comprising:

a first transmission line comprised of one signal line which branches off from a signal line for transmitting an input signal corresponding to a modulated wave signal;

a second transmission line comprised of the other signal line which branches off from said input signal transmitting signal line;

a mixer circuit having a first input terminal connected to said first transmission line and a second input terminal connected to said second transmission line;

a delay-amount variable delay line circuit placed in said second transmission line between a portion where said first transmission line and said second transmission line branch off from each other and the second input terminal of said mixer circuit;

a signal line for transmitting a reference signal having a predetermined frequency;

a ring oscillator capable of varying an oscillation frequency; and delay amount control means connected to the signal line for transmitting the reference signal, a signal line for transmitting a signal outputted from said ring oscillator, and a control section of said delay line circuit and a control section of said ring oscillator and for outputting the same control signal to the control section of said ring oscillator and the control section of said delay line circuit so that the frequency of the signal outputted from said ring oscillator coincides with that of the reference signal, wherein said delay line circuit comprises a plurality of stages of unit delay circuits, said ring oscillator comprises a plurality of stages of unit delay circuits disposed in ring form, and the unit delay circuits constituting said delay line circuit and the unit delay circuits constituting said ring oscillator respectively have the same circuit configuration.

7. A frequency voltage converter comprising:

a first transmission line comprised of one signal line which branches off from a signal line for transmitting an input signal corresponding to a modulated wave signal;

a second transmission line comprised of the other signal line which branches off from said input signal transmitting signal line;

a mixer circuit having a first input terminal connected to said first transmission line and a second input terminal connected to said second transmission line;

a delay-amount variable delay line circuit placed in said second transmission line between a portion where said first transmission line and said second transmission line branch off from each other and the second input terminal of said mixer circuit;

a signal line for transmitting a reference signal having a predetermined frequency;

a ring oscillator capable of varying an oscillation frequency;

a divider for inputting a signal outputted from said ring oscillator; and delay amount control means connected to the signal line for transmitting the reference signal, a signal line for transmitting a signal outputted from said divider, and a control section of said delay line circuit and a control section of said ring oscillator and for outputting the same control signal to the control section of said ring oscillator and the control section of said delay line circuit so that the frequency of the signal outputted from said divider coincides with that of the reference signal, wherein said delay line circuit comprises a plurality of stages of unit delay circuits, said ring oscillator comprises a plurality of stages of unit delay circuits disposed in ring form, and the unit delay circuits constituting said delay line circuit and the unit delay circuits constituting said ring oscillator respectively have the same circuit configuration.

8. The frequency voltage converter according to claim 2, wherein each of delay-amount variable delay element circuits which are connected and provided by a predetermined number within said each unit delay circuit so as to constitute said unit delay circuit, is a differential circuit provided with current amount control means and output amplitude control means.

9. The frequency voltage converter according to claim 2, wherein each of delay-amount variable delay element circuits which are connected and provided by a predetermined number within said each unit delay circuit so as to constitute said unit delay circuit, is configured so that amount-of-current control means are connected in series with CMOS inverter circuits.

10. The frequency voltage converter according to claim 2, wherein a phase detector having a first input terminal connected to said first transmission line and a second input terminal connected to said second transmission line is disposed in place of said mixer circuit.

11. The frequency voltage converter according to claim 10, wherein said phase detector is a phase detecting circuit for detecting only delayed phase.

12. The frequency voltage converter according to claim 6, wherein each of delay-amount variable delay element circuits which are connected and provided by a predetermined number within said each unit delay circuit so as to constitute said unit delay circuit, is a differential circuit provided with current amount control means and output amplitude control means.

13. The frequency voltage converter according to claim 6, wherein each of delay-amount variable delay element circuits which are connected and provided by a predetermined number within said each unit delay circuit so as to constitute said unit delay circuit, is configured so that amount-of-current control means are connected in series with CMOS inverter circuits.

14. The frequency voltage converter according to claim 6, wherein a phase detector having a first input terminal connected to said first transmission line and a second input terminal connected to said second transmission line is disposed in place of said mixer circuit.

15. The frequency voltage converter according to claim 14, wherein said phase detector is a phase detecting circuit for detecting only delayed phase.

16. The frequency voltage converter according to claim 7, wherein each of delay-amount variable delay element circuits which are connected and provided by a predetermined number within said each unit delay circuit so as to constitute said unit delay circuit, is a differential circuit provided with current amount control means and output amplitude control means.

17. The frequency voltage converter according to claim 7, wherein each of delay-amount variable delay element circuits which are connected and provided by a predetermined number within said each unit delay circuit so as to constitute said unit delay circuit, is configured so that amount-of-current control means are connected in series with CMOS inverter circuits.

18. The frequency voltage converter according to claim 7, wherein a phase detector having a first input terminal connected to said first transmission line and a second input terminal connected to said second transmission line is disposed in place of said mixer circuit.

19. The frequency voltage converter according to claim 18, wherein said phase detector is a phase detecting circuit for detecting only delayed phase.

20. The frequency voltage converter according to claim 2, wherein when the number of stage of the unit delay circuits series-connected in said first delay line circuit, the number of stage of the unit delay circuits series-connected in said second delay line circuit, the center frequency of the input signal, and the frequency of the reference signal are respectively defined as a, b, fc and fr, the numbers of stage for said first delay line circuit and said second delay line circuit are respectively set so that a/b=3fr/4fc or 3fr/2fc is established, and the frequency of the reference signal is adjusted.

* * * * *